United States Patent [19]

Yasaka et al.

[11] Patent Number: 4,902,530
[45] Date of Patent: Feb. 20, 1990

[54] METHOD OF CORRECTING A PATTERN FILM

[75] Inventors: Anto Yasaka; Yoshitomo Nakagawa; Mitsuyoshi Sato, all of Tokyo, Japan

[73] Assignee: Seiko Instruments Inc., Tokyo, Japan

[21] Appl. No.: 157,922

[22] Filed: Feb. 19, 1988

[51] Int. Cl.⁴ .............................................. B05D 3/06
[52] U.S. Cl. .................................. 427/38; 427/248.1; 427/282
[58] Field of Search ...................... 427/99, 8, 38, 259, 427/261, 255.6, 248.1, 282; 437/228

[56] References Cited

U.S. PATENT DOCUMENTS 4,698,236 10/1987 Kellogg et al. ..................... 427/43.1

FOREIGN PATENT DOCUMENTS 5313276 11/1978 Japan .
6094728 5/1985 Japan .

Primary Examiner—Bernard Pianalto
Attorney, Agent, or Firm—Spensley Horn Jubas & Lubitz

[57] ABSTRACT

According to the present invention, an apparatus for correcting a pattern film wherein an organic compound vapor is directed to a defect in a mask or IC while an ion beam is irradiated and scanned for depositing film on the white defect is furnished with a circuit for calculating film deposition area based on the reproduced image of a mask pattern, whereby elongating the total scanning time by inserting blank time in the scanning time, during which the ion beam is not irradiated (this operation is hereinafter referred to as blanking), when the ratio of the film deposition area to the ion beam current for an organic compound directed by a gas gun is lower than a predetermined level. Because of this operation, the molecule of the organic compound vapor is sufficiently deposited on the mask of IC surface, and therefore, a film having good light shielding or good conductance can be deposited with strong bonding.

5 Claims, 3 Drawing Sheets

METHOD OF CORRECTING A PATTERN FILM

BACKGROUND OF THE INVENTION

The present invention relates to an apparatus and a method for correcting a pattern film of lacking necessary portions of photomasks, reticles (hereinafter referred to as masks) used for manufacturing semiconductor devices or an integrated circuit through depositing film thereon with the use of ion beam.

FIG. 2 shows the principle of a conventional apparatus of correcting a pattern film. A gas gun 1 directs molecules of an organic compound 2 at a white defect 5 in a pattern 4 disposed on the surface of a substrate 3 for adsorption of the organic compound molecules. An ion beam scanning system 6 irradiates an ion beam 7 at a white defect 5 and scans the ion beam. As a result, a film of polymerised or carbonised organic compound molecules is deposited on the white defect. By repeating the scanning of the ion beam, a film is deposited to a thickness with required light-shielding when a sample is a photomak or reticle. The range of ion beam scanning depends on the size of a defect. In order to simplify the the structure of the ion beam scanning system 6, the current intensity of the ion beam is generally kept at constant, and the speed of ion beam scanning is adjusted at constant. The quantity of organic compound vapor from the gas gun is limited to the minimum so as not to pollute the inside of the vacuum chamber.

However, the drawback of the conventional apparatus for correcting a pattern film is that a film can not be deposited when the are of a defect is small.

FIG. 3 shows the relation between film deposition areas and frame numbers of ion beam scanning required to deposit a film of 2500Å thickness. This is a typical example of correcting a defect of a pattern film when a film thickness is 2500Å. Here, one frame means one complete scanning over the whole area of a defect. As shown in FIG. 3, as the film deposition area becomes 200 $\mu m^2$ or less, the number of frames required to obtain a predetermined film thickness increases. It further shows that film deposition becomes impossible when the area is 50 $\mu m^2$ or less. In the case of FIG. 3, the ion beam current is constantly maintained at 200 pA, and pyrene is used as an organic compound to be directed by the gas gun. Therefore, if the ion beam current is more than 200 pA, the number of frames for a required film thickness increases even when the film deposition area is more than 200 $\mu m^2$. And when the ion beam current is 200 pA or less, it becomes opposite. Therefore, when a film deposition area is small, the scanning time for a frame shortens because the speed of ion beam scanning is kept at constant. Consequently, during one frame scanning, the organic compound molecules to be polymerised or carbonised in the next frame can not sufficiently adsorb onto the current frame. Therefore, the drawback is that although an ion beam is irradiated, films can not be formed on top of another. Moreover, the surface of substrate and pattern is etched away due to spattering by the ion beam. This phenomenon becomes markedly stronger as the ion beam current becomes larger. This signifies that a film can not be obtained by the prior art when the ratio of film deposition area S to ion beam current I, S/I, is smaller than a certain level. In the foregoing, the phenomenon is described in case pyrene is used as an organic compound to be directed. However, the same phenomenon occurs in the case of other compounds.

BRIEF SUMMARY OF THE INVENTION

An object of the invention is to provide a apparatus for correcting a pattern film and method for correcting a pattern film to effectively correct a defect in a pattern film formed on a substrate by forming a film on the defect of sufficient thichness even when the area of the defect is very small.

In order to achieve the object, the present invention provides a mask repair apparatus for depositing film at a white defect on a mask by directing chemical compound at the white defect by a gas gun while an ion beam of constant intensity generated with an ion source concurrently being irradiated and scanned at a constant speed comprising means for displaying a mask pattern image based on the intensity distribution of secondary charged particles emitted from the surface of the mask, calculating a required film deposition area, and blanking the ion beam during scanning of ion beam when the ratio of film deposition area to ion beam current for an organic compound is lower than a predetermined value whereby elongating the total time for ion beam scanning. According to the structure and method described in the foregoing, even when a film deposition area is small, the scanning time per a frame can be elongated during which the adsorption of organic compound molecules occurs with sufficient density. As a result, films can be formed in layers at every frame to a required thickness.

DETAILED DESCRIPTION OF THE INVENTION

Figure 1:
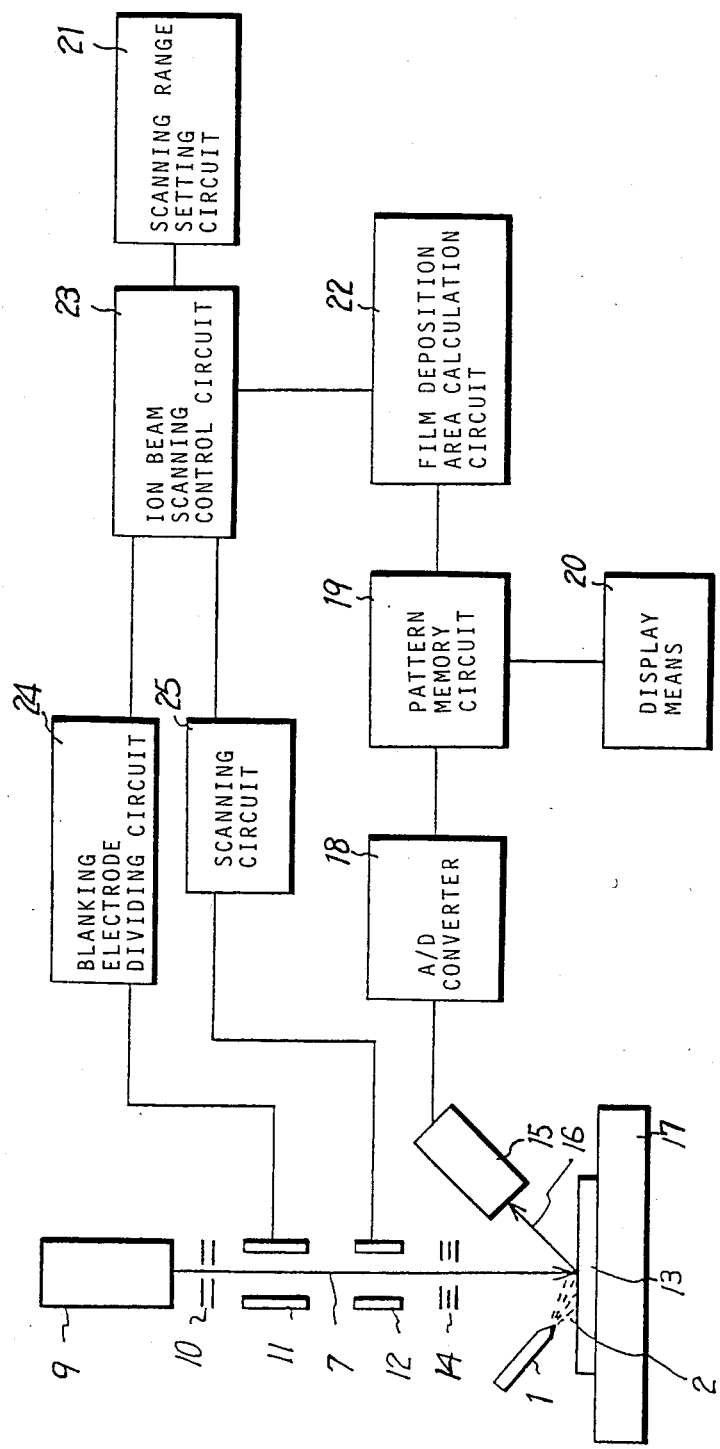
FIG. 1 illustrate a whole structure of the apparatus for correcting a pattern film according to the present invention.
Figure 2:
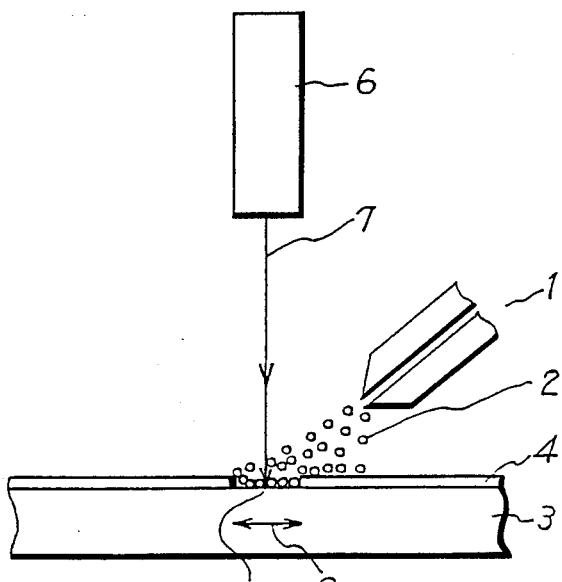
FIG. 2 shows the principle and a conventional apparatus for correcting a pattern film.
Figure 3:
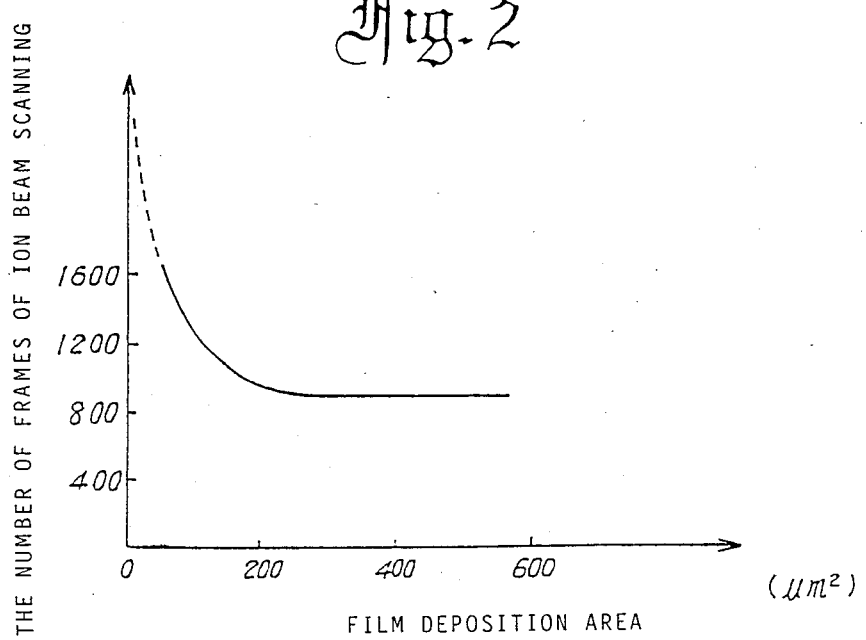
FIG. 3 shows a characteristic relation between film deposition area and the number of frames of ion beam scanning in the conventional apparatus for correcting a pattern film.

Embodiments of the present invention are hereunder described with reference to the drawings. FIG. 1 illustrates the whole construction of the apparatus for correcting a pattern film of a mask according to the present invention.

Liquid gallium ion source, for example, is used as an ion source 9. Ion current is converged into an ion beam 7 by a focusing lens 10. A blanking electrode 11 applies a strong deflecting voltage to the ion beam 7 and effects deflection of the ion beam 7. A scanning electrode 12 comprising two sets of electrodes in X and Y direction effects raster scanning of a spot of the ion beam 7 over the XY plane of a mask 13. An objective lens 14 focuses the ion beam 7 into a spot on the surface of the mask. A detection device 15 detects the intensity of secondary charged particles 16 (e.g., $Cr^+$ ion when the pattern is made of Cr.) of the pattern generated by the irradiation of the ion beam. The mask 13 is mounted on a XY stage 17. A gas gun 1 supplies an organic compound vapor 2 over a white defect of the mask 13. According to the foregoing, organic compound molecules (e.g. pyrene) adsorbs on the defect of the mask, and concurrently, the ion beam 7 is irradiated thereon to polymerise or corbonise the pyrene. The ion scanning is repeated to form films in layers for repairing the defect. Ion beam current is measured by a Faraday cup (not shown). An A/D converter 18 converts analog data of intensity distribution of the secondary charged particles 16 into digital data. The digital data is stored in a memory of a pattern memory circuit 19. In this apparatus, the scanning of ion beam 7 is carried out once before film deposition whereby observing the mask pattern. By this operation, an intensity distribution of the secondary charged particles is obtained as the mask pattern information. This information is converted into digital data and stored in the pattern memory circuit 19. The digital data is transmitted to a display means 20 (e.g. cathode-ray tube) and an enlarged image of the pattern is optically reproduced. An operator observes the enlarged image, confirms the location of the white defect, and accordingly inputs data of the range of ion beam scanning required for repairing the white defect into a scanning range setting circuit 22. At the same time, a film deposition area calculation circuit 22 operates. When the ratio of the film deposition area to ion beam current is lower than a predetermined value, a blanking signal is inputted to an ion beam scanning control circuit 23. For the predetermined value, a deposition area is selected at which the adsorption layer of pyrene molecules is no longer sufficiently formed because of the shortened scanning time per frame if the ion beam scanning is ordinarily carried out. The output of the ion beam scanning circuit is connected to a blanking electrode driving circuit 24 and a scanning circuit 25. The output of the blanking electrode driving circuit 24 is connected to the blanking electrode 11, and, when required, applies a strong deflecting voltage to deflect the ion beam 7 so that the ion beam 7 do not directly irradiate the mask 13. The output of the scanning circuit 25 is inputted to the scanning electrode 12 and supplies voltage required for raster scanning of the ion beam 7.

Figure 4:
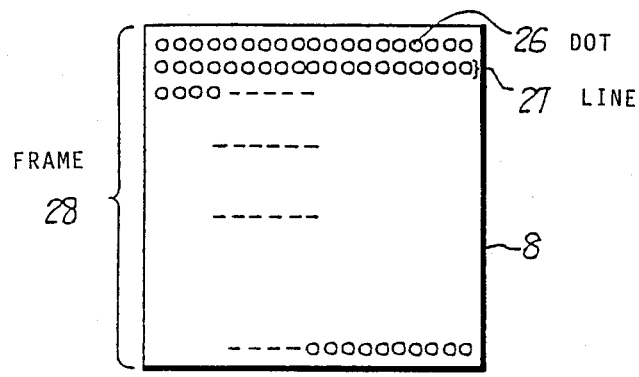
FIG. 4 shows an ion beam scanning operation by the apparatus for correcting a pattern film according to the present invention.

The following describes the operation when a blanking signal from the film deposition area calculation circuit 22 is inputted to the ion beam scanning control circuit. FIG. 4 shows an operation of the ion beam scanning. Within the range of ion beam scanning 8 (i.e. film deposition area), the ion beam spot shifts from the upper left to the right taking dots 26 as units. When a complete line 27 is formed with dots, scanning goes to the next line. By filling the ion beam scanning range with lines 27, a frame 28 is formed. Film deposition is carried out through repeatedly carrying out the frame 28. In the case of this apparatus, the time duration of irradiation for a dot is always constant. Therefore, when the rate of film deposition area to ion beam current is small, the number of dots is small, therefore the time duration for adsorption of pyrene gas is short. In such case, blanking is carried out through the use of the blanking electrode 11 whereby inserting blank time during the scanning to create sufficient time duration for adsorption of pyrene gas. Blanking operation may be carried out in, for example, three different ways such as hereunder described. However, it is not limited to these examples.

Figure 5:
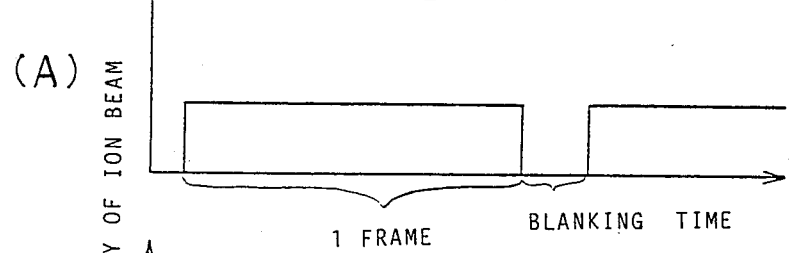
FIG. 5 shows actual waveforms in the embodiments.
Figure 5:
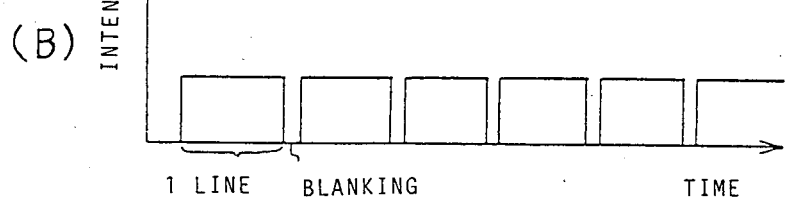
Figure 5:
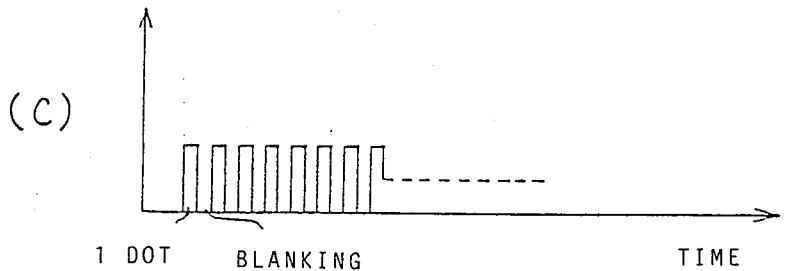

FIG. 5 (A) shows an example of blanking carried out at each completion of a frame.

FIG. 5(B) shows an example of blanking carried out at each completion of a line.

FIG. 5(C) shows an example of blanking carried out at each completion of a dot.

Blanking may also be carried out at intervals of a plurality of frames, a plurality of lines or a plurality of dots.

This invention is applied to re-arange a pattern film of an integrated circuit(IC) by forming a new conductive pattern film. In re-aranging a pattern film of an IC, in FIG. 1 sample 13 is an IC formed a pattren film and a vapor of an organic compound 2 is of an organic compound containing metal component such as hexacarbonyl metal. According to the structure and method described in the foregoing, even when a film deposition area is small, the scanning time per a frame can be elongated during which the adsorption of organic compound molecules occurs with sufficient density. As a result, films can be formed in layers at every frame to a required thickness.

We claim:

1. A method of correcting a defect in the form of an opening in a pattern film on a substrate by depositing a film at the defect comprising steps of irradiating an ion beam on the pattern film to generate secondary charged particles from the pattern film, the secondary charged particles having an intensity distribution, displaying a mask pattern image based on the intensity distribution of the secondary charged particles, calculating a required film deposition area, directing a chemical compound vapor at the defect by a gas gun for depositing said chemical compound on the defect, concurrently irradiating and scanning an ion beam of a constant intensity at a constant speed for forming a film on the defect, and blanking the ion beam during scanning when the ratio of film deposition area to ion beam current for said organic compound is lower than a predetermined value whereby elongating the time duration for depositing said chemical compound.

2. A method of correcting a defect of a pattern film according to claim 1, wherein said blanking is carried out at intervals of one frame or a plurality of frames of ion beam scanning.

3. A method of correcting a defect of a pattern film according to claim 2, wherein said blanking is carried out at intervals of one line or a plurality of lines of ion beam scanning.

4. A method of correcting a defect of a pattern film according to claim 1, wherein said blanking is carried out at intervals of one dot or a plurality of dots of ion beam scanning.

5. A method of correcting a defect in the form of an opening in a pattern film on a substrate by depositing a film at the defect comprising steps of irradiating an ion beam on the pattern film to generate secondary charged particles from the pattern film, the secondary charged particles having an intensity distribution, displaying a mask pattern image based on the intensity distribution of the secondary charged particles, calculating a required film deposition area, directing a chemical compound vapor at the defect by a gas gun for depositing said chemical compound on the defect, concurrently irradiating and scanning an ion beam of a constant intensity at a constant speed for forming a film on the defect, and blanking the ion beam during scanning when the film deposition area is smaller than a predetermined value whereby elongating the time duration for depositing said chemical compound.

* * * * *